United States Patent
Gay et al.

(10) Patent No.: US 12,289,884 B2
(45) Date of Patent: Apr. 29, 2025

(54) INTEGRATED CIRCUIT COMPRISING AT LEAST ONE BIPOLAR TRANSISTOR AND A CORRESPONDING METHOD OF PRODUCTION

(71) Applicant: STMicroelectronics (Rousset) SAS, Rousset (FR)

(72) Inventors: Romeric Gay, Aix-en-Provence (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 408 days.

(21) Appl. No.: 17/747,540

(22) Filed: May 18, 2022

(65) Prior Publication Data
US 2022/0375954 A1   Nov. 24, 2022

(30) Foreign Application Priority Data

May 21, 2021   (FR) ........................................ 2105334

(51) Int. Cl.
*H10B 41/40*   (2023.01)
*H10B 41/30*   (2023.01)

(52) U.S. Cl.
CPC ............. *H10B 41/40* (2023.02); *H10B 41/30* (2023.02)

(58) Field of Classification Search
CPC ........ H10B 41/40; H10B 41/30; H10B 41/42; H01L 21/8222; H01L 29/0649; H01L 29/66272; H01L 29/7373; H01L 27/0823
See application file for complete search history.

(56) References Cited

U.S. PATENT DOCUMENTS

| | | | |
|---|---|---|---|
| 4,780,430 A * | 10/1988 | Musumeci | H01L 21/8222 438/360 |
| 2008/0210980 A1 | 9/2008 | Disney et al. | |
| 2013/0249570 A1 * | 9/2013 | Voelkel | H03K 17/955 324/683 |
| 2018/0033784 A1 | 2/2018 | Appaswamy et al. | |
| 2019/0333992 A1 | 10/2019 | Agam et al. | |
| 2021/0151450 A1 * | 5/2021 | Or-Bach | H10B 10/18 |

FOREIGN PATENT DOCUMENTS

| | | |
|---|---|---|
| DE | 4101419 A1 | 7/1991 |
| FR | 2987697 A1 | 9/2013 |
| WO | 2004079789 A2 | 9/2004 |
| WO | 2011008919 A1 | 1/2011 |

OTHER PUBLICATIONS

INPI Search Report and Written Opinion for priority application, FR 2105334, report dated Jan. 14, 2022, 11 pgs.

\* cited by examiner

*Primary Examiner* — Douglas W Owens
(74) *Attorney, Agent, or Firm* — Crowe & Dunlevy LLC (57) ABSTRACT

A bipolar transistor includes a common collector region comprising a buried semiconductor layer and an annular well. A well region is surrounded by the annular well and delimited by the buried semiconductor layer. A first base region and a second base region are formed by the well region and separated from each other by a vertical gate structure. A first emitter region is implanted in the first base region, and a second emitter region is implanted in the second base region. A conductor track electrically couples the first emitter region and the second base region to configure the bipolar transistor as a Darlington-type device. Structures of the bipolar transistor may be fabricated in a co-integration with a non-volatile memory cell.

12 Claims, 7 Drawing Sheets

INTEGRATED CIRCUIT COMPRISING AT LEAST ONE BIPOLAR TRANSISTOR AND A CORRESPONDING METHOD OF PRODUCTION

PRIORITY CLAIM

This application claims the priority benefit of France Application for Patent No. 2105334, filed on May 21, 2021, the content of which is hereby incorporated by reference in its entirety to the maximum extent allowable by law.

TECHNICAL FIELD

The embodiments and implementations relate to integrated circuits, in particular bipolar transistors, and methods for the production of bipolar transistors.

BACKGROUND

A bipolar transistor generally includes a doped semiconductor base region of a first type, for example the p-type, a doped semiconductor collector region of a second type, for example the n-type, adjacent to the base region, and a doped semiconductor emitter region of the second type, adjacent to the base region.

When the semiconductor substrate in which the bipolar transistor is formed is doped with the first type, a doped well of the second type forming the collector region typically surrounds the base region, which makes it possible to electrically insulate the base region and the substrate with two opposite PN junctions.

Integrated circuits including principally "digital" electronic devices, such as logic circuits in complementary technology CMOS (Complementary Metal Oxide Semiconductors) and non-volatile memory circuits for storing digital data, may include bipolar transistors found, for example, in generator circuits (like a band gap circuit) with a reference voltage independent of the temperature.

The steps for manufacturing bipolar transistors in this type of integrated circuit are typically cointegrated with manufacturing steps of digital electrical devices, i.e., the steps executed simultaneously with steps provided for other digital elements, and not specifically dedicated to bipolar transistors.

For example, the formation of the collector region may be cointegrated in a step of forming an insulation region buried in the depth of the semiconductor substrate, as part of a triple well type structure.

The formation of the base region may be cointegrated in a step of forming a logic circuit transistor well.

The formation of the emitter region may be cointegrated into a step of forming source regions and drain regions of CMOS transistors.

Pooling the manufacturing steps can reduce manufacturing costs, but the resulting semiconductor regions of bipolar transistors are typically poorly optimized. The bipolar transistors may perform poorly as a result, in particular with a "beta" current gain $\beta$ which may be less than 10, whereas a comparable bipolar transistor made by dedicated and optimized steps may have a current gain $\beta$ of between 100 and 200.

The "Darlington" transistor configuration, i.e., a common collector configuration of at least two bipolar transistors, wherein the emitter of an upstream bipolar transistor is connected to the base of a downstream bipolar transistor, makes it possible to form an equivalent bipolar transistor whose current gain $\beta$ is greater. The equivalent current gain $\beta$ of the Darlington configuration is given by a polynomial of order "n" of the value of the current gain $\beta$ of a single bipolar transistor, "n" being the number of bipolar transistors in the Darlington configuration.

However, this type of configuration has the disadvantage of multiplying by "n" the space occupied by the Darlington configuration compared to a single bipolar transistor and multiplying by "n" the activation voltage (base-emitter voltage) relative to a single bipolar transistor. This becomes particularly problematic when "n" is greater than or equal to three (n≥3).

Consequently, there is a need for embodiments of bipolar transistors which perform well, in particular have a high current gain $\beta$, without increasing the space occupied by a bipolar transistor and limiting the value of the activation voltage.

SUMMARY

In this respect, according to one aspect an integrated circuit is proposed including at least one bipolar transistor arranged in and/or on a doped semiconductor substrate of a first type. The bipolar transistor includes: a common collector region comprising a buried semiconductor layer in the depth of the doped substrate of a second type opposite the first type, and a doped annular well of the second type joining the buried semiconductor layer; a doped semiconductor well of the first type surrounded by the annular well and delimited by the buried semiconductor layer, the doped semiconductor well of the first type containing a first base region and a second base region; a doped first emitter region of the second type located in the first base region, and a doped second emitter region of the second type located in the second base region; a conductor track for electrically coupling the first emitter region with the second base region; and a vertical gate structure extending vertically across the semiconductor well containing the base regions to the buried semiconductor layer so as to electrically insulate the first base region and the second base region.

In other words, a Darlington transistor type configuration with two bipolar transistors is proposed, but with a single "triple well" containing the two base regions, i.e., having the size of a standard form of a single bipolar transistor.

Indeed, the space occupied by the vertical gate structure, for mutually insulating the first base region and the second base region inside the well, is negligible in relation to the size of bipolar transistors. In particular, the space occupied by the vertical gate structure is much smaller than the space occupied for insulating the base regions in the standard manner of wells doped opposite the type of doping of the base regions.

According to one embodiment, the vertical gate structure comprises a trench filled with a conductive material electrically insulated by a dielectric shell on the bottom and sides of the trench.

According to one embodiment, the vertical gate structure further comprises a region implanted at the bottom of the trench, doped by the second type, occupying a space between the bottom of the trench and the buried semiconductor layer in the semiconductor well containing the base regions.

Indeed, it is possible that the trench filled with a conductive material in a dielectric shell reaches the buried semiconductor layer, in which case the electrical insulation between the two base regions is fully formed by the trench, in particular by the dielectric shell. In this case, in practice, it is possible that the trench does not reach the buried semiconductor layer, and in this case the vertical gate structure advantageously includes said region implanted between the bottom of the trench and the buried semiconductor layer. The electrical insulation between the two base regions is thus formed by the region implanted in the bottom of the trench and by the dielectric shell.

According to one embodiment, the vertical gate structure extends vertically into the semiconductor well containing the base regions from a front face of the semiconductor well containing the base regions and extends longitudinally, in a direction of the plane of the front face, diametrically from one edge of the annular well surrounding the semiconductor well containing the base regions to the other.

According to one embodiment, the integrated circuit also includes said at least bipolar transistor, at least one non-volatile memory cell including a floating gate transistor and a buried access transistor with vertical gate, and wherein the semiconductor well containing the base regions has the same depth, the same composition and the same concentration of dopants as a well of the memory cell containing a region for forming the channel of the floating gate transistor.

The channel region of the floating gate transistor is generally the region between the source and drain regions of the floating gate transistor.

Apart from the fact that the semiconductor well containing the base regions of the bipolar transistor may be formed in cointegration with the well of the memory cell, the depth of the memory cell wells is advantageously lower than the triple wells of other types of embodiments. Furthermore, the concentration of dopants in the well of the memory cell is advantageously lower than the concentrations of triple wells of other types of embodiments, making it possible to increase the resistance of the base region, and consequently increase the voltage resistance of PN junctions formed with the well.

This results in an increase in the current gain $\beta$ of the bipolar transistors formed in each base region. Indeed, the current gain $\beta$ is inversely proportional to the concentration of dopants of the base and inversely proportional to the depth of the base (emitter-collector distance). However, the cointegration of the bipolar transistor with a non-volatile memory cell makes it possible to reduce the depth and the concentration of dopants in the well containing base regions.

According to one embodiment: the buried semiconductor layer of the common collector region has the same composition and the same depth as a buried semiconductor layer forming a source plane extending below the well of the memory cell; the annular well of the common collector region has the same composition and the same structure as an annular well surrounding the well of the memory cell and permitting electrical contact with the buried semiconductor layer forming the source plane; and the vertical gate structure electrically insulating the first base region and the second base region has the same structure and the same size as a gate structure of the buried access transistor with vertical gate.

According to one embodiment, said at least one bipolar transistor belongs to a temperature-independent reference voltage generating circuit.

According to another aspect, a method is proposed for manufacturing an integrated circuit in a doped semiconductor substrate of a first type, comprising producing at least one bipolar transistor, comprising: forming a common collector region comprising an implantation in the depth of the substrate of a buried semiconductor layer doped by second type opposite the first type, and an implantation of a doped semiconductor annular well of the second type joining the buried semiconductor layer; implanting a doped semiconductor well of the first type in a region surrounded by the annular well and delimited by the buried semiconductor layer; forming a vertical gate structure extending vertically through the doped semiconductor well of the first type to the buried semiconductor layer, so as to electrically insulate a first base region and a second base region in the doped semiconductor well of the first type; implanting a doped first emitter region of the second type in the first base region, and a doped second emitter region of the second type in the second base region; and forming a conductor track electrically coupling the first emitter region to the second base region.

In one embodiment, forming the vertical gate structure comprises etching a trench, forming a dielectric shell on the bottom and sides of the trench and filling the trench with an electrically conductive material.

In one embodiment, forming the vertical gate structure also comprises implanting a doped implanted region of the second type at the bottom of the trench, so as to occupy a space in the doped semiconductor well of the first type between the bottom of the trench and the buried semiconductor layer.

In one embodiment, the vertical gate structure is formed so as to extend vertically in the doped semiconductor well of the first type from a front face of the doped semiconductor well of the first type, and to extend longitudinally in a direction of the plane of the front face, diametrically from one edge of the annular well surrounding the doped semiconductor well of the first type to the other.

In one embodiment, the method also includes manufacturing at least one non-volatile memory cell including a floating gate transistor and a buried access transistor with vertical gate, wherein implanting the doped semiconductor well of the first type is performed at the same time as implanting a well of the memory cell containing a channel region of the floating gate transistor.

In one embodiment: implanting the common collector region in the depth of the buried semiconductor layer is performed at the same time as implanting a buried semiconductor layer in the depth of a buried semiconductor layer which forms a source plane extending below the well of the memory cell; implanting the annular well of the common collector region is performed at the same time as implanting an annular well surrounding the well of the memory cell and permitting electrical contact with the buried semiconductor layer forming the source plane; and forming the vertical gate structure electrically insulating the first base region and the second base region is performed at the same time as forming a gate structure of the buried access transistor with vertical gate.

BRIEF DESCRIPTION OF THE DRAWINGS

Other advantages and features of the invention are given in the following detailed description of an embodiment and implementation, which are not to be considered limiting, and accompanying drawings, in which.

DETAILED DESCRIPTION

Figure 1:
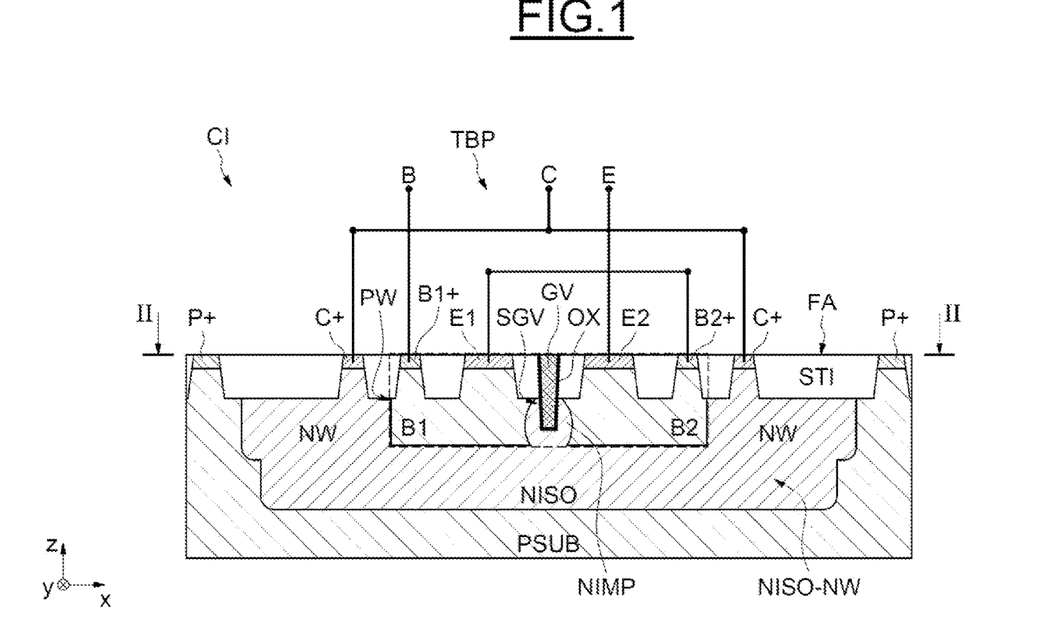
FIGS. 1 and 2 illustrate an exemplary embodiment of a bipolar transistor.
Figure 2:
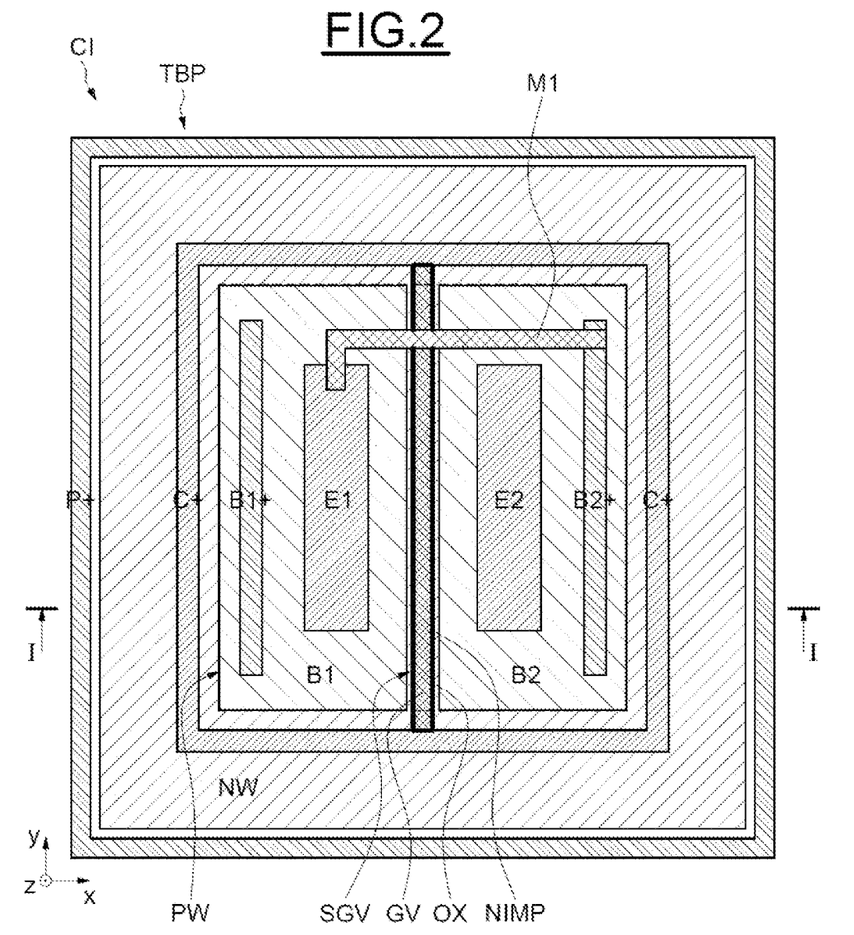

FIGS. 1 and 2 illustrate an exemplary embodiment of a bipolar transistor TBP of an integrated circuit CI. FIG. 1 illustrates a cross-sectional view of the bipolar transistor TBP in plane I-I of FIG. 2, whereas FIG. 2 illustrates a top view of the bipolar transistor TBP in plane II-II of FIG. 1.

The bipolar transistor TBP is formed in a doped semiconductor substrate PSUB of a first type, for example the p-type.

The bipolar transistor TBP is designed in the manner of a Darlington type configuration with two-bipolar-transistors, wherein a single "triple well" contains the two base regions, i.e., a Darlington configuration with two transistors with the size of a standard form of single bipolar transistor.

Figure 3:
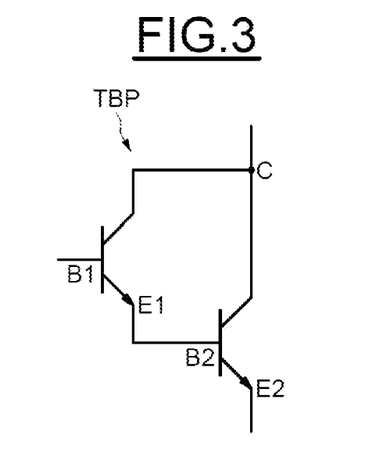
FIG. 3 illustrates a Darlington configuration with two transistors equivalent to the bipolar transistor.

Reference is made to FIG. 3 which illustrates the Darlington configuration with two transistors equivalent to the bipolar transistor TBP. Each transistor includes a collector region C, a base region B1, B2 and an emitter region E1, E2. The collector regions C of the two transistors are coupled together, the emitter region E1 of the "upstream" transistor is coupled to the base region of the "downstream" transistor (the terms "upstream" and "downstream" are defined by this coupling). The common collector region C forms the equivalent collector region of the bipolar transistor TBP, the base region B1 of the upstream transistor forms the equivalent base region of the bipolar transistor TBP, and the emitter region E2 of the transistor downstream forms the equivalent emitter region of the bipolar transistor TBP.

When the upstream transistor and the downstream transistor of the Darlington configuration each have the same current gain $\beta_0$, so the equivalent current gain $\beta$ of the bipolar transistor TBP can be expressed by $\beta=\beta_0^2+2*\beta_0$. The equivalent base-emitter threshold voltage Vbe of the bipolar transistor TBP is the sum of the threshold voltages $Vbe_0$ of the upstream and downstream transistors, i.e., $Vbe=Vbe_0+Vbe_0$. For example $\beta=168$ if $\beta_0=12$, and $Vbe=1.2V$ if $Vbe_0=0.6V$.

Reference is once again made FIGS. 1 and 2. The two base regions B1, B2 are formed in the same well PW of a triple well structure. A triple well structure which makes it possible to electrically insulate the well PW with the same type of doping as the substrate PSUB (for example the p-type) by means of a doped insulation well NISO-NW of the opposite type (for example the n-type) encompassing the insulated well PW. Thus, PN junctions with opposite polarities formed with the insulation well NISO-NW make it possible to electrically insulate the well PW from the substrate PSUB.

The well PW containing the two base regions B1, B2 is thus surrounded laterally, i.e., in x and y directions, by a doped annular well NW of the second type, and is delimited in depth, i.e., in vertical direction z, by a doped buried semiconductor layer NISO of the second type. The annular well NW extends in depth until it joins the buried semiconductor layer NISO.

The term "annular" denotes a ring form which is not necessarily circular, i.e. a geometric area delimited by an inner perimeter and an outer perimeter parallel to one another. In the view from above (FIG. 2), the annular form of the well NW corresponds to a substantially square frame.

Furthermore, the buried semiconductor region NISO and the doped annular well NW both of the second type form the common collector region C. Highly doped contact zones C+ are formed in the annular well NW at a front face (in an xy plane), which make it possible to connect a metal terminal of collector C.

To electrically insulate the first base region B1 contained in the well PW and the second base region B2 also contained in the well PW, the bipolar transistor includes a vertical gate structure SGV extending vertically through the semiconductor well PW between the base regions B1, B2 to the buried semiconductor layer NISO.

The vertical gate structure SGV comprises a trench filled with a conductive material GV electrically insulated by a dielectric shell OX on the bottom and sides of the trench.

This type of vertical gate structure SGV corresponds to a vertical gate structure of a buried transistor, used in particular as an access transistor TA (see, FIG. 9) in non-volatile memory cells CEL (see, FIG. 9) of integrated circuits.

The vertical gate structure SGV can thus be advantageously manufactured "free of charge" in conjunction with the corresponding manufacturing steps of the memory cell CEL. The vertical gate structure SGV will thus have the same structure (i.e., the same layout, and the same materials) and the same size (in particular the depth) as the gate of the buried access transistor with vertical gate TA (see, FIG. 9).

In a first alternative (not explicitly shown in FIG. 1), the trench filled with a conductive material GV has a depth which extends vertically through the well PW until it reaches, or penetrates, the buried semiconductor layer NISO. In this case, the dielectric shell OX and the conductive material GV which is left at a floating potential, allow the first base region B1 and the second base region B2 to be electrically insulated from one another.

In a second alternative (represented in FIGS. 1 and 2), the trench filled with a conductive material GV has a depth which extends vertically into the well PW but does not reach the buried semiconductor region NISO. However, the vertical gate structure SGV may include an implanted region NIMP at and about (for example extending from) the bottom of the trench, doped by the second type, joining the buried semiconductor layer NISO.

The implanted region NIMP thus occupies a space left in the semiconductor well PW containing the base regions, between the bottom of the trench and the buried semiconductor layer NISO and makes it possible to achieve electrical insulation between the two base regions B1, B2.

Figure 9:
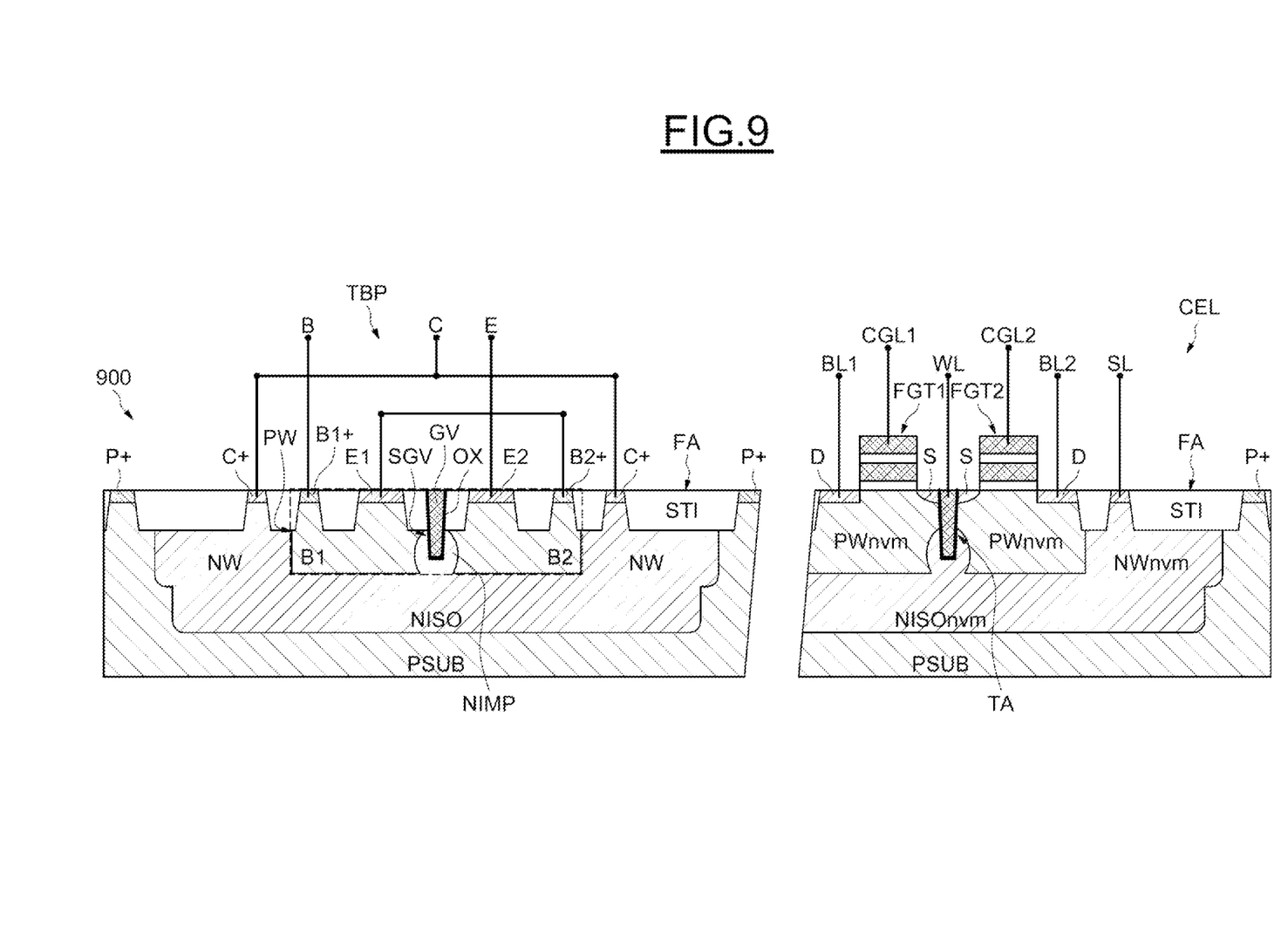

This second alternative corresponds in particular to the case of cointegrated manufacture with a buried access transistor TA with a vertical gate of a non-volatile memory cell CEL (see, FIG. 9).

Thus, the vertical gate structure SGV extends vertically into the semiconductor well PW from the front face FA to the buried semiconductor layer NISO (visible in FIG. 1).

Longitudinally, i.e., in a direction of the plane of the front face FA, for example in y-direction, the vertical gate structure SGV extends diametrically from one edge of the annular well NW to the other (visible in FIG. 2).

Thus, the vertical gate structure SGV occupies a very small space in the well PW to mutually insulate two base regions B1, B2 in the same well PW. This makes it possible to form two transistors arranged in a Darlington configuration in an area corresponding to a conventional design of a single bipolar transistor.

Lastly, a doped first emitter region E1 of the second type is located in the first base region B1, and a doped second emitter region E2 of the second type is located in the second base region B2.

A conductor track M1, for example formed by a metal track in a metal level of an interconnection part of the integrated circuit CI, makes it possible to form the Darlington configuration by electrically coupling the first emitter region E1 (for example belonging to the "upstream" transistor of the Darlington configuration) with the second base region B2 (for example belonging to the "downstream" transistor of the Darlington configuration).

The emitter regions E1, E2, as well as the contact zones B1+, B2+ of the respective base regions B1, B2, and the contact zones C+ of the common collector region C, are formed locally by highly concentrated implantations of dopants, at the front face FA in openings of lateral insulation regions STI.

The lateral insulation regions STI are, for example, of standard shallow trench insulation (STI) designs, which are not shown in the top view of FIG. 2 to improve readability.

Furthermore, as described in the following, in connection with FIGS. 5 to 9, the manufacture of the bipolar transistor TBP can be carried out in cointegration with other manufacturing steps of the non-volatile memory cell CEL.

On the one hand, the cointegration has the economic advantage of manufacturing the bipolar transistor TBP without an additional step, i.e., without additional cost.

On the other hand, the cointegration with non-volatile memory technologies makes it possible to improve the performance of the bipolar transistor TBP, in addition and in combination with the quadratic increase of the current gain $\beta$ of the Darlington configuration.

Indeed, the current gain $\beta_0$ of one of the two transistors of the Darlington configuration, may be expressed as a function of $(\mu_n/\mu_p \cdot 1/W_b \cdot N_e/N_b)$, where $\mu_n$ is the mobility of n-type carriers, $\mu_p$ is the mobility of p-type carriers, $W_b$ is the width of the base region, $N_e$ is the concentration of the dopants of the emitter region, and $N_b$ is the concentration of dopants of the base region.

In other words, the current gain $\beta_0$ is inversely proportional to the concentration of dopants of the base $N_b$ and inversely proportional to the width of the base $W_b$ (emitter-collector distance).

In the embodiment of the bipolar transistor TBP as represented in FIG. 1, the width of the base $W_b$ corresponds substantially to the depth of the well PW, i.e. the distance between the buried semiconductor layer NISO and the front face FA.

However, the depth of the memory cell wells is typically smaller than the depth of triple wells of other types of embodiments, in particular due to the size of the vertical gate region of the access transistors. In practice, a second depth implantation of a buried semiconductor layer is made above the buried semiconductor layer NISO. In the representations of the drawings, this second buried semiconductor layer belongs to the layer NISO. In addition, the concentration of dopants of the memory cells wells is typically lower than the concentrations in the triple wells of other embodiments, in particular in order to increase the voltage resistance of the PN junctions formed with the well.

Thus, by reducing the width of the base $W_b$ and by reducing the concentration of the base dopants $N_b$ due to the cointegration with the memory cell formation CEL, the current gain $\beta_0$ of each of the two transistors of the Darlington configuration is increased.

For example, the current gain $\beta_0$ may be substantially 12 in the case of cointegration with a memory cell CEL, representing more than 2 times the current gain of a bipolar transistor generally cointegrated with CMOS (Complementary Metal Oxide Semiconductors) logic transistors.

The equivalent current gain $\beta$ of the bipolar transistor TBP, as previously expressed in relation to FIG. 3, benefits from this gain proportionally and quadratically, which may be in the order of 30 times the current gain of a conventional bipolar transistor mentioned above.

The value of the current gain $\beta \approx 170$ of the bipolar transistor TBP described in relation to FIGS. 1 to 3, can be obtained by a Darlington type configuration of three standard bipolar transistors, each having a current gain substantially equal to 5 and each having the same size as the bipolar transistor TBP. The base-emitter threshold voltage of the Darlington configuration with three conventional transistors is therefore 3*0.6V=1.8V.

Consequently, the bipolar transistor TBP described in relation to FIGS. 1 to 3 makes it possible to divide by three the size of such a standard design, while limiting the base-emitter threshold voltage Vbe to 1.2V.

In addition to the immediate advantage of reducing the size of the bipolar transistor TBP, this also has an advantage in terms of reliability, in particular in terms of the transistors matching. Indeed, matching errors may be the result of distant positions of corresponding transistors; however, having three times fewer transistors within a group of transistors also makes it possible to reduce the distance between the most distant transistors in the group and thus improve the matching.

In particular, the temperature-independent reference voltage generating circuits need high current gain and are sensitive to matching errors.

Figure 4:
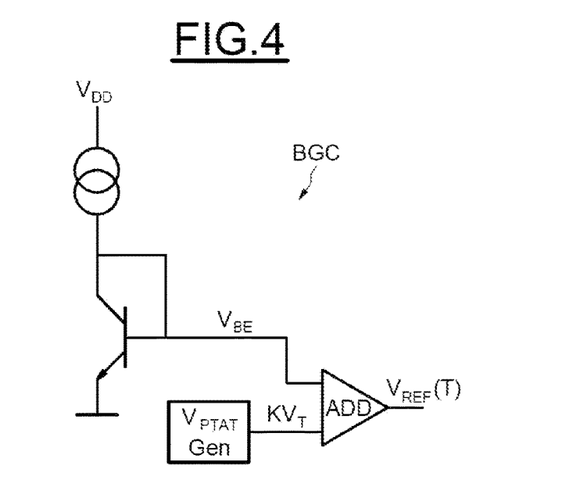
FIG. 4 illustrates a temperature-independent voltage generator circuit (of a bandgap type)

Reference is made in this respect to FIG. 4 which illustrates a circuit BGC adapted to generate a temperature-independent voltage (usually a bandgap voltage generator circuit). The circuit BGC includes two input branches of an adder ADD, each branch including bipolar transistors. A first branch includes a current generator injecting current into a collector of a diode-connected bipolar transistor, the emitter to ground. As a result, the base-emitter voltage $V_{BE}$ of this transistor provides a signal that decreases with temperature at one input of the adder ADD. A temperature-proportional current generator circuit $V_{PTAT}$ Gen generates a signal increasing with temperature on the other input of the adder ADD. The sum of the two signals $V_{BE}$, $KV_T$ is substantially constant with the temperature and constitutes the temperature-independent reference voltage signal $V_{REF}(T)$.

In this type of circuit BGC, a low current gain $\beta$ affects the accuracy, the precision, and variations with temperature quite significantly.

Consequently, the bipolar transistor TBP as described in relation to FIGS. 1 to 3 belongs advantageously to a temperature-independent reference voltage generating circuit BGC.

FIGS. 5 to 9 illustrate the steps and results of steps of an example of the method of production of the bipolar transistor TBP as described above in connection with FIGS. 1 to 3.

In this example, the bipolar transistor TBP is made entirely in cointegration with the manufacturing steps of memory cells CEL, made in the same semiconductor substrate PSUB, for example in doped silicon of the first type, typically the p-type.

Figure 5:
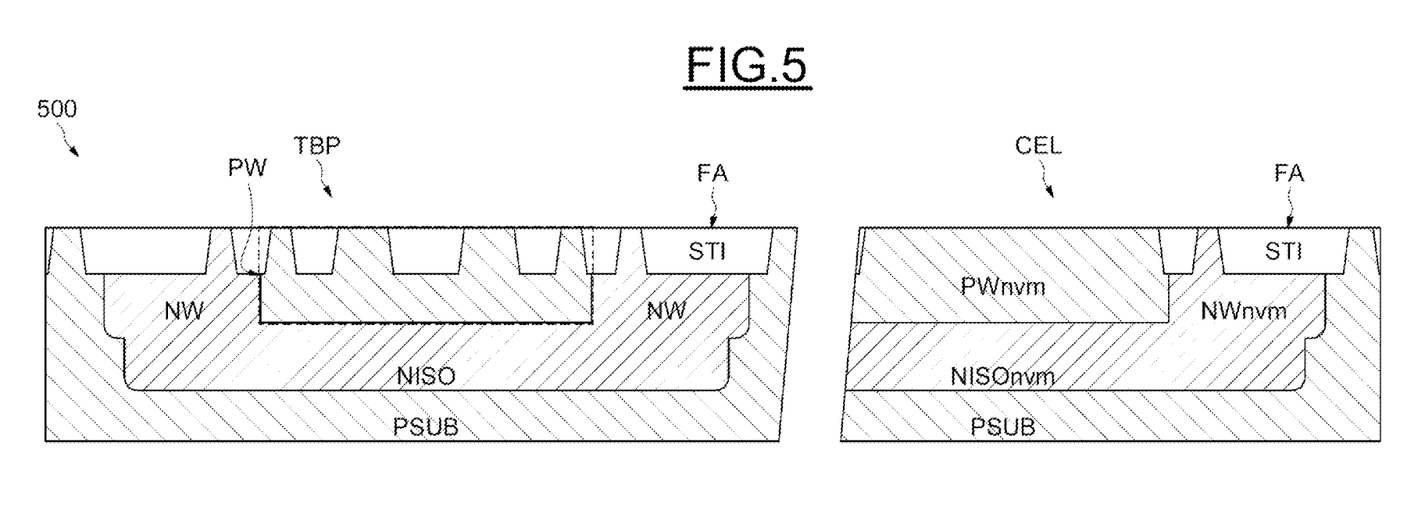
FIGS. 5 to 9 illustrate steps in the manufacture of a bipolar transistor carried out in cointegration with the manufacture of a non-volatile memory cell.

FIG. 5 illustrates a result 500 of steps of manufacturing shallow insulation trenches STI, comprising typically the etching of openings referred to as "trenches" from the front face FA of the PSUB substrate and filling the trenches with a dielectric material such as silicon oxide.

The result 500 also illustrates the result of implantation steps of a "triple well" type structure in the bipolar transistor part TBP and in the memory cell part CEL.

The implantation steps of the "triple wells" thus include:

a depth implantation of the buried semiconductor layer NISO of the common collector region C of the bipolar transistor TBP, at the same time as a depth implantation of a buried semiconductor layer NISOnvm for forming a source plane extending below a well PWnvm containing the memory cell CEL. The buried semiconductor layers NISO, NISOnvm are doped by a second type, opposite the first type, for example the n-type;

an implantation of the annular well NW of the common collector region C of the bipolar transistor, at the same time as an implantation of an annular well NWnvm surrounding the well containing the memory cell PWnvm. The annular wells NW, NWnvm are implanted with energy making it possible to reach the depth of the semiconductor layers NISO, so as to form an insulating structure in continuity with said buried semiconductor layers NISO, NISOnvm. The annular wells NW, NWnvm are doped by the second type, for example n-type; and an implantation of the doped semiconductor well PW of the first type intended to contain the base regions B1, B2 (see, FIG. 6), at the same time as an implantation of a well of the memory cell PWnvm intended to contain in particular a channel region of the floating gate transistor FGT1, FGT2 (see, FIG. 9).

In particular, the dopants of doped wells PW, PWnvm of the first type, respectively, intended to contain the base regions B1, B2 and the memory cell CEL, have a concentration between $2*10^{12}$ cm$^{-3}$ and $3*10^{13}$ cm$^{-3}$. This relatively low concentration is intended in particular to ensure a high avalanche voltage of the PN junctions in the part of the memory cell CEL, which advantageously makes it possible to increase the current gain β of the bipolar transistor TBP.

Furthermore, the depth of said wells PW, PWnvm, delimited by the vertical position of the buried semiconductor layers NISO, NISOnvm, is for example between 300 nm and 700 nm. This relatively small depth is provided in order to limit the etching time of the trenches TR, TRta (FIG. 6) to approximately this depth, which advantageously makes it possible to increase the current gain β of the bipolar transistor TBP.

Figure 6:
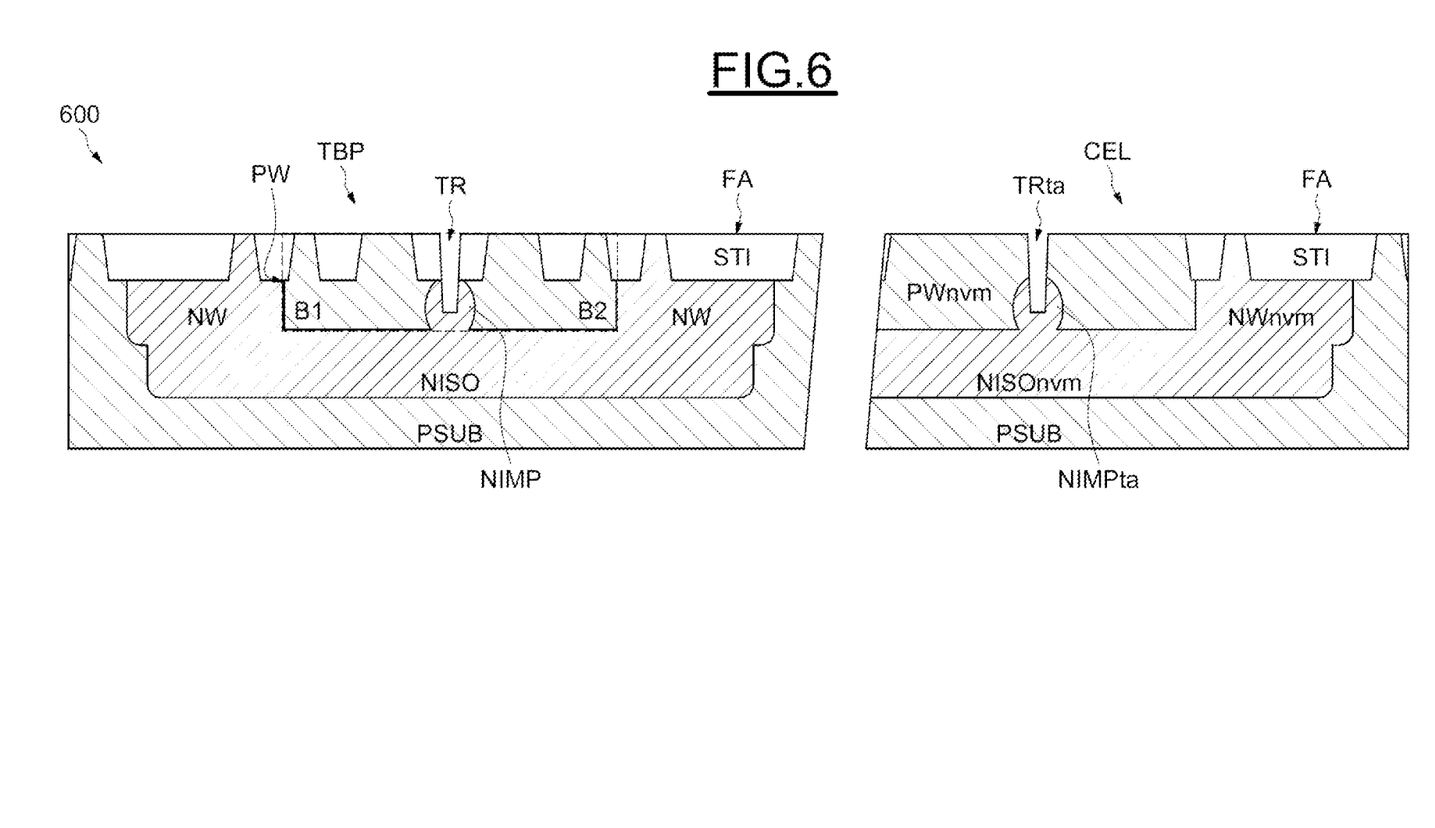

FIG. 6 illustrates the result of an etching step 600 to open the trenches TR, TRta in which the vertical gate structure electrically insulating the first base region B1 and the second base region B2 of the bipolar transistor and the vertical gate of the access transistor TA (FIG. 9) of the memory cell CEL are formed.

An implantation is also performed at and about (for example, from the bottom of) the trenches TR, TRta, in the respective wells PW, PWnvm. Thus, respective implanted regions NIMP, NIMPta, doped by the second type, for example the n-type, occupy a space between the bottom of the trenches TR, TRta and the buried semiconductor layers NISO, NISOnvm.

The implantation of the implanted region NIMPta at the bottom of the trench TRta of the memory cell CEL makes it possible, in particular, to form a source region contacting the source plane NISOnvm, and this advantageously makes it possible to ensure the electrical insulation between the two base regions B1, B2 in the well PW of the bipolar transistor TBP.

On the one hand, in the representation of FIG. 6, the trenches TR, TRta are represented with the same depth. However, strictly speaking, the trench TR of the bipolar transistor TBP is slightly deeper than the trench TRta of the memory cell CEL. Indeed, the trench TR of the bipolar transistor TBP passes through a lateral insulation region STI, and the anisotropic etching used to form the trenches TR, TRta may be faster in the dielectric material of the lateral insulation regions STI than in the crystalline silicon of the well PWnvm.

On the other hand, the implanted region NIMP initially from the bottom of the trench TR in the well PW of the bipolar transistor TBP is represented after diffusion, and thus extends from the bottom of the shallow insulation trenches STI to the buried semiconductor layer NISO.

This effectively provides electrical insulation between the first base region B1 and the second base region B2. However, the structure within the trench TR, i.e., in particular the dielectric shell OX formed at step 700 described in relation to FIG. 7, could by itself provide electrical insulation between the first base region B1 and the second base region B2 in the case where the deeper depth of the trench TR extends through to reach the buried semiconductor layer NISO region.

Figure 7:
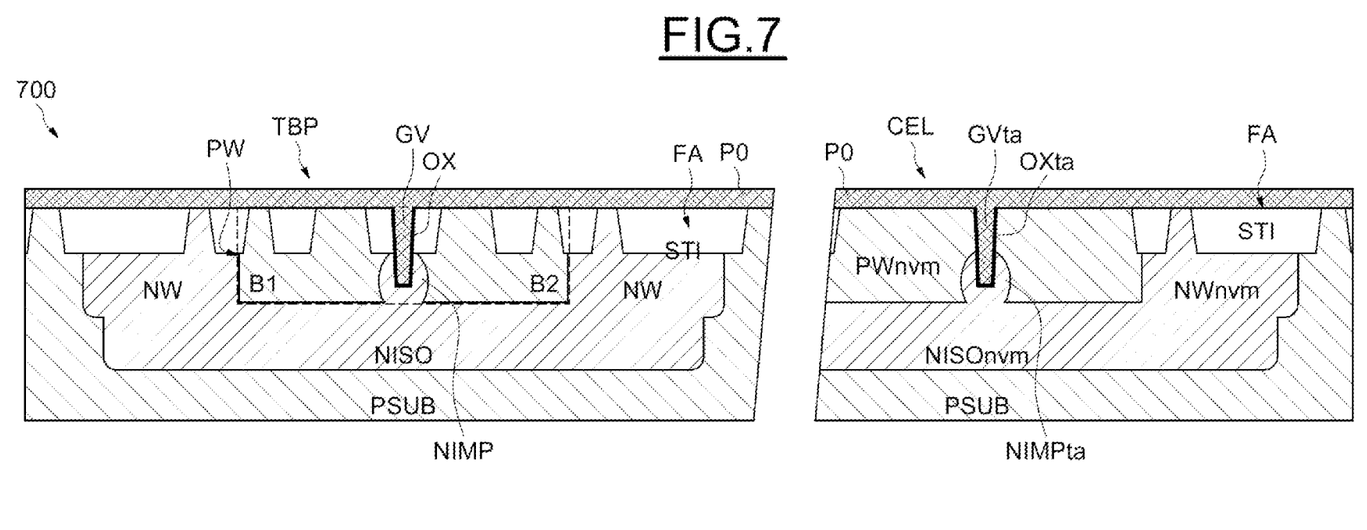

FIG. 7 illustrates a step 700 comprising a formation of a dielectric shell OX on the bottom and sides of the trench TR of the bipolar transistor TBP, at the same as forming a gate dielectric shell of OXta of the access transistor of the memory cell CEL.

Step 700 also includes filling to excess trenches TR, TRta with an electrically conductive material P0, for example polycrystalline silicon.

Figure 8:
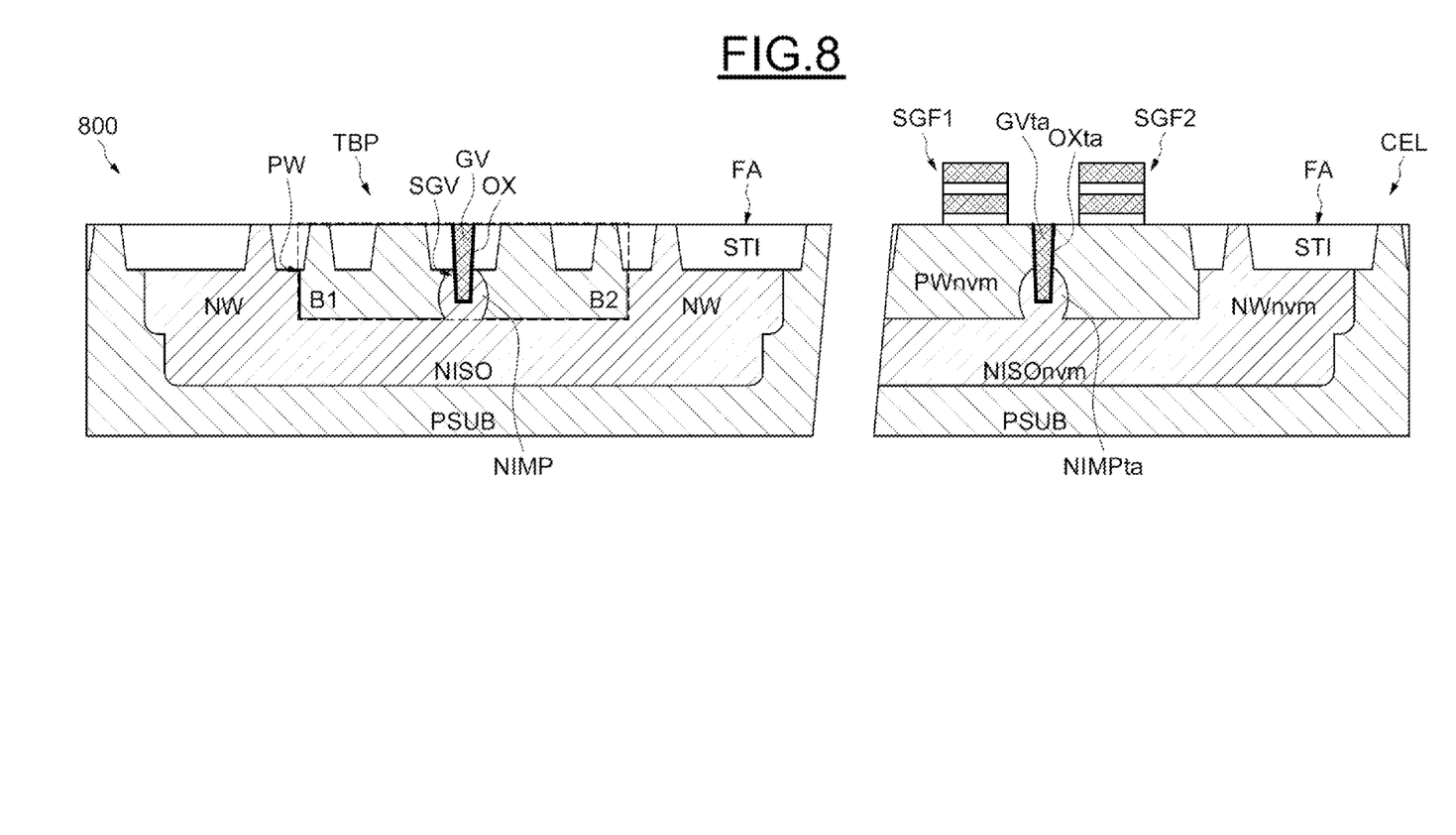

FIG. 8 illustrates the result 800 of a removal of the excess conductive material P0, i.e., the portion of conductive material P0 covering the front face FA of the semiconductor substrate PSUB, typically by chemical-mechanical polishing.

Furthermore, floating gate structures SGF1, SGF2 have been formed in the memory cell part CEL.

The floating gate structures SGF1, SGF2 typically include a tunnel dielectric layer on the front face FA of the well PWnvm, a floating gate region on the tunnel dielectric, an inter-gate dielectric layer on the floating gate and a control gate region on the inter-gate dielectric layer.

FIG. 9 illustrates the result 900 of a step of implanting the second type of dopants, for example n-type, emitter regions E1, E2, collector contact zones C+ into openings of the shallow insulation trenches STI provided for this purpose, at the same time as a self-aligned implantation of source regions S and drain regions D on both sides of the floating gate structures FGT1, FGT2, and source plane contact zones SL NISOnvm.

Furthermore, an implantation of the first type of dopants, for example p-type, base region contact zones B1+, B2+ are formed in openings of the shallow insulation trench STI provided for this purpose in the respective base regions B1, B2, together with an implantation of substrate contact zones P+ in openings of the shallow insulation trench STI provided for this purpose in the substrate PSUB.

Furthermore, contact pillars are made on the strongly implanted regions B1+, B2+, C+, E1, E2 in order to couple the first emitter region E1 with the second base region B2+, for example by means of a metal track M1; and to form a base terminal B of the bipolar transistor TBP on the first base region B1+, an emitter terminal E of the bipolar transistor TBP on the second emitter region E2, and a collector terminal C of the bipolar transistor TBP on the collector contact zone C+.

At the same time, contact pillars are formed in the memory cell CEL in order to form bit line terminals BL1, BL2 on the drain regions D, word line terminals WL on the conductive gate of the access transistor TA, control gate line terminals CGL1, CGL2 on the control gates of the floating gate structures SGF1, SGF2, and a source plane terminal SL on the source plane contact area NWnvm, NISOnvm.

The invention claimed is:

1. An integrated circuit including a Darlington type bipolar transistor arranged in and/or on a doped semiconductor substrate of a first type, the Darlington type bipolar transistor comprising:
a common collector region for a first transistor and a second transistor of said Darlington type bipolar transistor, the common collector region comprising a buried semiconductor layer of a second type opposite the first type in the doped semiconductor substrate, and a doped annular well of the second type joining the buried semiconductor layer;
a doped semiconductor well of the first type surrounded by the annular well and delimited by the buried semiconductor layer;
a vertical structure extending vertically through the doped semiconductor well to divide the doped semiconductor well to contain a first base region for the first transistor electrically insulated from a second base region for the second transistor;
a doped first emitter region of the second type for the first transistor located in the first base region;
a doped second emitter region of the second type for the second transistor located in the second base region; and
a conductor track for electrically coupling the first emitter region for the first transistor with the second base region for the second transistor.

2. The integrated circuit according to claim 1, wherein the vertical structure comprises a trench filled with a conductive material that is electrically insulated by a dielectric shell on a bottom and sides of the trench.

3. The integrated circuit according to claim 2, wherein the vertical structure further comprises an implanted region in the doped semiconductor well containing the first and second base regions doped by the second type and occupying a space between the bottom of the trench and the buried semiconductor layer.

4. The integrated circuit according to claim 1, wherein the vertical structure extends vertically in the doped semiconductor well containing the first and second base regions from a front face of the doped semiconductor well, and extends longitudinally, in a direction of a plane of the front face, diametrically from one edge to another edge of the doped annular well surrounding the doped semiconductor well.

5. The integrated circuit according to claim 1, further including a non-volatile memory cell including a floating gate transistor and a buried transistor access transistor with a vertical gate, wherein the doped semiconductor well containing the first and second base regions has a same depth, a same composition and a same concentration of dopants as a well of the non-volatile memory cell which contains a channel region of the floating gate transistor.

6. The integrated circuit according to claim 5, wherein:
the buried semiconductor layer of the common collector region has a same composition and a same depth as a buried semiconductor layer constituting a source plane extending below the well of the non-volatile memory cell;
the doped annular well of the common collector region has a same composition and a same structure as an annular well surrounding the well of the non-volatile memory cell and which allows for electrical contact to be made with the buried semiconductor layer forming the source plane; and
the vertical structure electrically insulating the first base region and the second base region has a same structure and a same size as the vertical gate of the buried access transistor.

7. The integrated circuit according to claim 1, wherein said Darlington type bipolar transistor is a circuit component of a temperature-independent reference voltage generating circuit.

8. An integrated circuit, comprising:
a doped semiconductor substrate of a first type;
a buried semiconductor layer of a second type opposite the first type in the doped semiconductor substrate;
a doped annular well of the second type in contact with the buried semiconductor layer;
wherein the doped annular well surrounds a doped semiconductor well of the first type;
an insulating structure extending vertically through the doped semiconductor well to divide the doped semiconductor well to contain a first region of the first type electrically insulated from a second region of the first type;
a first doped region of the second type located in the first region;
a second doped region of the second type located in the second region;
an electrical connection of the first doped region to the second region;
wherein said integrated circuit is a Darlington type bipolar transistor including a first transistor and second transistor having a common collector formed by the buried semiconductor layer and the doped annular well, a first base of the first transistor formed by the first region, a second base of the second transistor formed by the second region, a first emitter of the first transistor formed by the first doped region and a second emitter of the second transistor formed by the second doped region.

9. The integrated circuit according to claim 8, wherein the insulating structure comprises a trench.

10. The integrated circuit according to claim 9, wherein said trench is filled with a conductive material that is electrically insulated by a dielectric shell on a bottom and sides of the trench.

11. The integrated circuit according to claim 9, wherein the insulating structure further comprises an implanted region doped by the second type in the doped semiconductor well, said implanted region occupying a space between the bottom of the trench and the buried semiconductor layer.

12. The integrated circuit according to claim 8, wherein the insulating structure extends vertically in the doped semiconductor well from a front face of the doped semiconductor well, and extends longitudinally, in a direction of a plane of the front face, diametrically from one edge to another edge of the doped annular well surrounding the doped semiconductor well.

* * * * *